(12) United States Patent
Chang et al.

(10) Patent No.: US 8,426,873 B2
(45) Date of Patent: Apr. 23, 2013

(54) LED PACKAGE STRUCTURE

(75) Inventors: Kuangyao Chang, Guangdong (CN);
Weiwei Zheng, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 13/130,120

(22) PCT Filed: Apr. 26, 2011

(86) PCT No.: PCT/CN2011/073299
§ 371 (c)(1),
(2), (4) Date: May 19, 2011

(87) PCT Pub. No.: WO2012/136011
PCT Pub. Date: Oct. 11, 2012

(65) Prior Publication Data
US 2012/0256214 A1   Oct. 11, 2012

(30) Foreign Application Priority Data
Apr. 7, 2011   (CN) .......................... 2011 1 0086900

(51) Int. Cl.
*H01L 27/15* (2006.01)
(52) U.S. Cl.
USPC .......... 257/81; 257/82; 257/98; 257/E33.056; 257/E33.073

(58) Field of Classification Search ..................... 257/81, 257/82, 98–100, E33.056, E33.059, E33.073, 257/E33.074
See application file for complete search history.

(56) References Cited

U.S. PATENT DOCUMENTS 7,279,346 B2 *  10/2007  Andrews et al. ................ 438/27
2009/0242919 A1  10/2009  Lin et al.

FOREIGN PATENT DOCUMENTS

| CN | 1905220 A | 1/2007 |
| CN | 101159307 | 4/2008 |
| CN | 101366127 A | 2/2009 |
| CN | 201638841 U | 11/2010 |

* cited by examiner

*Primary Examiner* — Zandra Smith
*Assistant Examiner* — Paul Patton
(74) *Attorney, Agent, or Firm* — Harness, Dickey & Pierce, PLC

(57) ABSTRACT

The present invention discloses an LED package structure which has a housing, an LED chip and a transparent encapsulant. The housing has a recess and a plurality of protrusions. The LED chip is mounted in the recess of the housing, and covered in the recess by the transparent encapsulant. The protrusions are formed in the recess or on the edge of the housing. The protrusions of the present invention can form the uneven shape of the surface of the transparent encapsulant, so as to increase the diffusion angle of the light and enhance the light extraction efficiency.

10 Claims, 5 Drawing Sheets

LED PACKAGE STRUCTURE

FIELD OF THE INVENTION

The present invention relates to a light emitting diode (LED) package structure, and more particularly to an LED package structure having a transparent encapsulant with an uneven surface.

BACKGROUND OF THE INVENTION

A liquid crystal display (LCD) is a type of flat panel display (FPD), which shows images by the property of liquid crystal material. Comparing with other display devices, the liquid crystal display has advantages in lightweight, compactness, low driving voltage and low power consumption, and thus has already become the mainstream product in the whole consumer market. However, the liquid crystal material of the liquid crystal display cannot emit light by itself, and must depend upon an external light source. Thus, the liquid crystal display further has a backlight module to provide the needed light source.

Generally, the backlight module can be divided into two types, i.e. the side-light type backlight module and the direct-light type backlight module. Traditional backlight modules mainly use cold cathode fluorescent lamps (CCFLs), hot cathode fluorescent lamps (HCFLs) or semiconductor emitting diodes as light sources, wherein the semiconductor emitting diodes mainly use light emitting diodes (LEDs) to emit light. In comparison with the cathode fluorescent lamps, the light emitting diodes can save more electric power, have longer lifetime, and more compact volume, so that there is a trend to gradually use the light emitting diodes to replace the cathode fluorescent lamps.

Nowadays, an LED is generally in form of chip to be assembled into a semiconductor package, i.e. an LED package structure, which is finally connected to a fixed plate of a backlight module. Product types of the LED package structures are classified according to condition features including light colors, chip material, luminance, size and etc. A single chip generally can construct a point type light source, while a plurality of assembled chips can construct a surface type light source or a linear type light source for the purpose of signaling, indicating status, or displaying. The light emitting display is constructed by a plurality of chips suitably connected (in series or in parallel) and suitable optical structures, all of which construct light emitting sections and light emitting points of the light emitting display. Furthermore, a surface-mounting-device type LED (SMD-LED) is attached to a surface of a circuit board, so that it is suitably applied to a SMT (surface mounting technology) process for carrying out reflowing. Thus, it can efficiently solve problems of brightness, visual angle, evenness, reliability, uniformity and etc. Moreover, the SMD-LED is used with lighter material of a PCB board and a reflective layer, and omitted terminals made of carbon steel in a dip type LED, so that epoxy resin filled in a display reflective layer can be reduced, and a half of product weight of the SMD-LED can be easily removed to finally optimize the application thereof. Thus, the SMD-LED gradually replaces the terminal type LED, and can provide more flexible designs, especially occupying a market share in the LED display market and having a trend of rapidly developing.

Referring now to FIG. 1, a cross-sectional view of a traditional LED package structure is illustrated. As shown in FIG. 1, a traditional LED package structure 90 comprises a housing 91, a first electrode plate 92, a second electrode plate 93, an LED chip 94 and a transparent encapsulant 95. An upper surface of the housing 91 is formed with a recess 911. A portion of the first electrode plate 92 is disposed on the bottom of the recess 911, and the other portion thereof is extended out of the housing 91 for being electrically connected with an external power supply. A portion of the second electrode plate 93 is disposed on the bottom of the recess 911, and the other portion thereof is extended out of the housing 91 for being electrically connected with an external power supply. The LED chip 94 has a first electrode (not-shown) and a second electrode (not-shown). The LED chip 94 is disposed in the recess 911, wherein the first electrode is electrically connected with the first electrode plate 92, and the second electrode is electrically connected with the second electrode plate 93 through a first wire 96. The transparent encapsulant 95 encapsulates the recess 911 and covers the components in the recess 911, wherein the light of the LED 94 can emit upward through the transparent encapsulant 95.

In the traditional LED package structure 90, the design of the housing 91 should have an ideal transparent encapsulant 95 with a horizontal surface. However, due to the shrinkage of the material of the transparent encapsulant 95 after hardening and the surface tension action on the surface of the transparent encapsulant 95 enclosed by the edge of the recess 911 of the housing 91, a central portion of the surface of the transparent encapsulant 95 is actually in a recessed status. Because the refractive index of the transparent encapsulant 95 is greater than that of the air, a portion of light will be total reflected when the light passes through an interface between the surface of the transparent encapsulant 95 and the air. Even though the light of total reflection is reflected from walls of the recess 911 and then emits out of the transparent encapsulant 95, the light still will be attenuated to affect the light extraction efficiency.

Referring now to FIG. 2, a cross-sectional view of another traditional LED package structure is illustrated. As shown in FIG. 2, the LED package structure 90' of FIG. 2 is substantially the same as the LED package structure 90 of FIG. 1, and the difference between the two traditional LED package structures 90 and 90' is that: the transparent encapsulant 95' of the LED package structure 90' of FIG. 2 has a design of a convex lens. Thus, it can prevent from the attenuation condition due to the total reflection of the light, as described above, while the light can be efficiently emitted outward with a greater visual angle. However, it will relatively increase the manufacture cost of the transparent encapsulant 95'. Meanwhile, because the transparent encapsulant 95' is protruded from the housing 91', it is disadvantageous to execute the following SMT or other manufacturing processes of the LED package structure 90'.

As a result, it is necessary to provide an LED package structure to solve the problems existing in the conventional technologies, as described above.

SUMMARY OF THE INVENTION

The present invention provides an LED package structure, which is used to overcome the problem of the light extraction efficiency existing in the foregoing traditional LED package structure.

A primary object of the present invention is to provide an LED package structure, which is formed with a plurality of protrusions in a recess of a housing or on an edge of the housing, so that a surface of a transparent encapsulant has an uneven profile to increase the diffusion angle of the light and enhance the light extraction efficiency.

Another object of the present invention is to provide an LED package structure, wherein different arrangements of the protrusions can further change and control the visual angle of light emitted by the LED package structure, so as to suitably satisfy different usage needs.

A still further object of the present invention is to provide an LED package structure, wherein the protrusions or protruded walls are provided to advantageously take or place the LED package structure as a sucking manner of a sucker, so that it is suitably applied to normal manufacturing processes of surface mounting technology (SMT).

To achieve the above object, the present invention provides a light emitting diode (LED) package structure which comprises:

a housing having a recess and a plurality of protrusions;
an LED chip mounted in the recess of the housing; and
a transparent encapsulant encapsulating the recess of the housing and covering the LED chip in the recess, wherein the transparent encapsulant has an uneven surface.

In one embodiment of the present invention, the protrusions are formed on a bottom surface of the recess, and the protrusions are higher than an edge of the housing.

In one embodiment of the present invention, the transparent encapsulant encapsulates the protrusions.

In one embodiment of the present invention, the protrusions are cones which are arranged in a circular array or a mirror symmetrical arrangement with respect to the LED chip.

In one embodiment of the present invention, the protrusions are plates which are arranged in a mirror symmetrical arrangement with respect to the LED chip.

In one embodiment of the present invention, the housing further comprises at least one protruded wall, and a height of the protruded wall is greater than that of the protrusions.

In one embodiment of the present invention, a surface of each of the protrusions has a reflective layer.

To achieve the above object, the present invention further provides a light emitting diode (LED) package structure which comprises:

a housing having a recess and a plurality of protrusions, wherein a periphery of the housing is extended upward to form the protrusions;
an LED chip mounted in the recess of the housing; and
a transparent encapsulant encapsulating the recess of the housing and covering the LED chip in the recess, wherein the transparent encapsulant has an uneven surface.

In one embodiment of the present invention, the protrusions are formed on two opposite sides of the recess, and arranged in a multi-stage arrangement descending from the centermost one of the protrusions to the outermost one thereof.

In one embodiment of the present invention, the protrusions are radially arranged.

To achieve the above object, the present invention further provides a light emitting diode (LED) package structure which comprises:

a housing having a recess and a plurality of protrusions, wherein the protrusions is formed on a bottom surface of the housing, and the protrusions are higher than an edge of the housing;
an LED chip mounted in the recess of the housing;
a transparent encapsulant encapsulating the recess of the housing and covering the LED chip in the recess, wherein the transparent encapsulant has an uneven surface; and
at least one protruded wall having a height greater than that of the protrusions.

The present invention provides an LED package structure which comprises a housing, an LED chip and a transparent encapsulant. The housing has a recess and a plurality of protrusions. The LED chip is mounted in the recess of the housing, and covered in the recess by the transparent encapsulant. The protrusions are formed in the recess or on the edge of the housing. The protrusions of the present invention can form the uneven shape of the surface of the transparent encapsulant, so as to increase the diffusion angle of the light and enhance the light extraction efficiency.

DETAILED DESCRIPTION OF THE PREFERRED EMBODIMENTS

The structure and the technical means adopted by the present invention to achieve the above and other objects can be best understood by referring to the following detailed description of the preferred embodiments and the accompanying drawings. For clearly showing primary features of the LED package structure, the perspective views in the accompanying drawings of the present invention show the primary features in a schematic manner.

Figure 1:
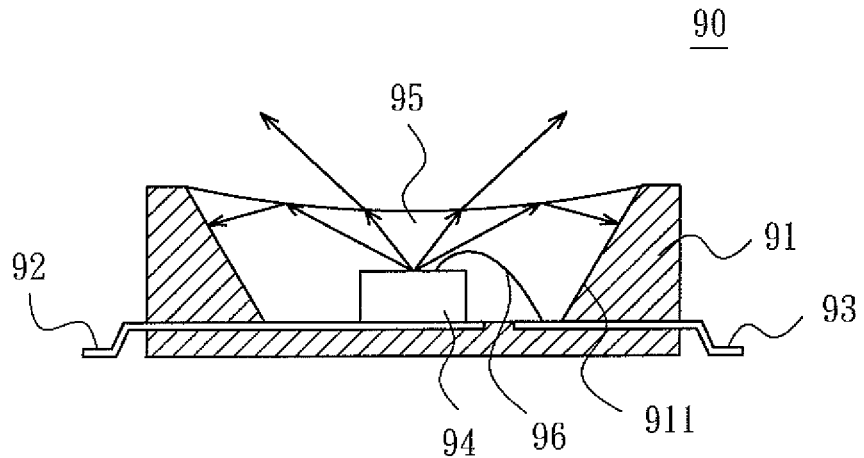
FIG. 1 is a cross-sectional view of a traditional LED package structure.
Figure 2:
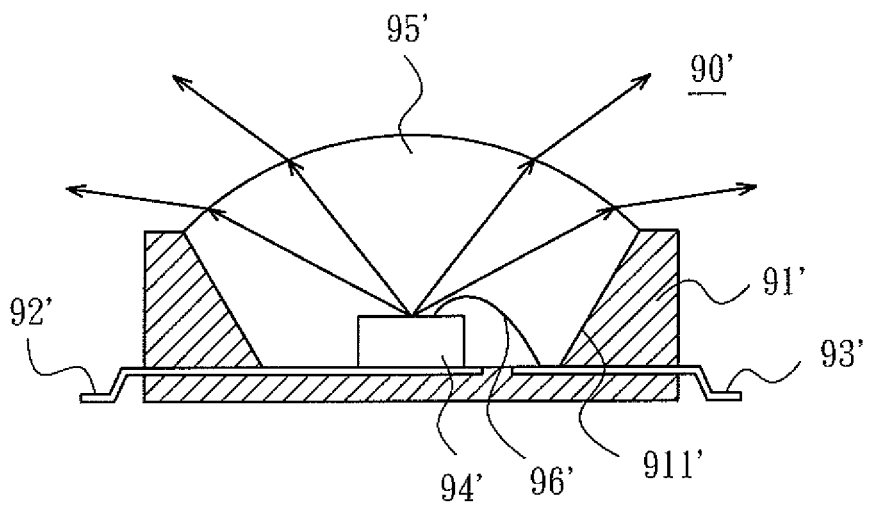
FIG. 2 is a cross-sectional view of another traditional LED package structure.
Figure 3A:
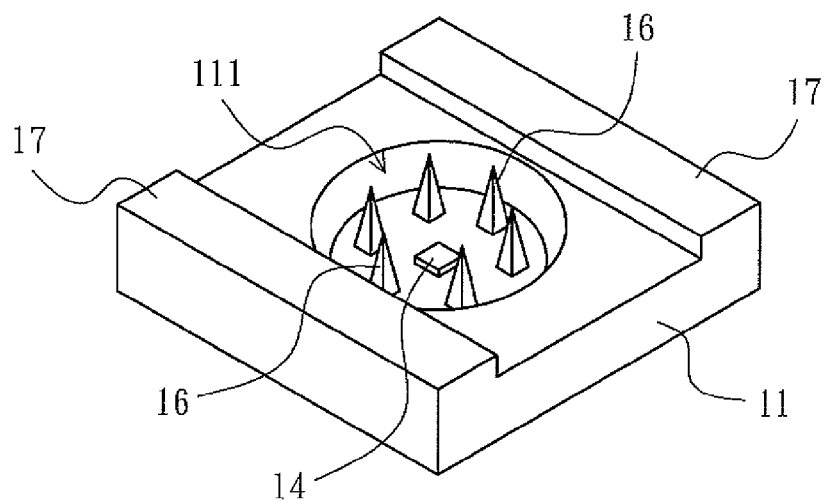
FIG. 3A is a perspective view of a housing and an LED chip of an LED package structure according to a first embodiment of the present invention.
Figure 3B:
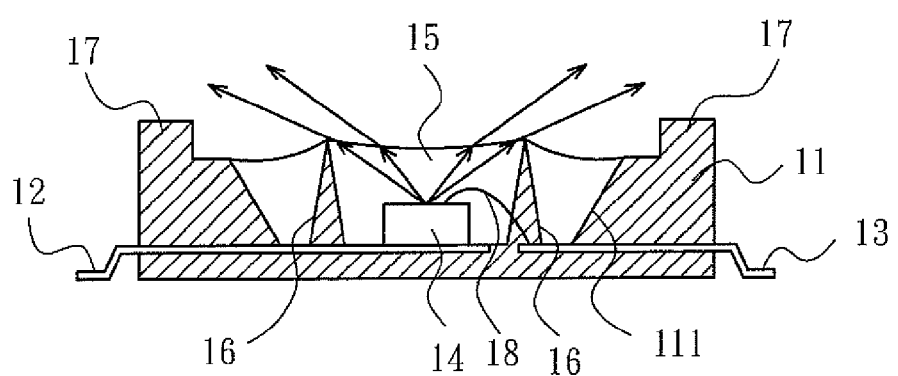
FIG. 3B is a cross-sectional view of the LED package structure according to the first embodiment of the present invention.

Referring now to FIGS. 3A and 3B, FIG. 3A is a perspective view of a housing and an LED chip of an LED package structure according to a first embodiment of the present invention; and FIG. 3B is a cross-sectional view of the LED package structure according to the first embodiment of the present invention. The LED package structure 10 comprises: a housing 11, a first electrode 12, a second electrode 13, an LED chip 14 and a transparent encapsulant 15.

The housing 11 has a recess 111 which is a recessed structure, and the shape of the recess 111 can be adjusted corresponding to product needs. The housing 11 further comprises a plurality of protrusions 16 which are formed on a bottom surface of the recess 111 of the housing 11, wherein the protrusions 16 are arranged in a circular array (matrix). Preferably, the protrusions 16 are cones which are higher than an edge of the housing 11, and a surface of each of the protrusions 16 has a reflective layer (not-shown).

A portion of the first electrode plate 12 is disposed in the recess 111, and the other portion thereof is extended out of the housing 11 for being electrically connected with an external power supply. A portion of the second electrode plate 13 is disposed in the recess 111, and the other portion thereof is extended out of the housing 11 for being electrically connected with an external power supply. The LED chip 14 has a first electrode (not-shown) and a second electrode (not-shown). The LED chip 14 is disposed in the recess 111, and the LED chip 14 is located at a center of a circle defined by the protrusions 16. The first electrode is electrically connected with the first electrode plate 12, and the second electrode is electrically connected with the second electrode plate 13 through a first wire 18.

The transparent encapsulant 15 encapsulates the recess 111 and covers the LED 14, the portion of the first electrode plate 12, the portion of the second electrode plate 13 and the protrusions 16 in the recess 111. As shown in FIG. 3B, after molding the transparent encapsulant 15, the surface of the transparent encapsulant 15 will be formed with protruded appearance at the positions of the protrusions 16 due to the surface tension action. In other words, the protrusions 16 change the surface shape of the transparent encapsulant 15.

Furthermore, preferably, the housing 11 of the LED package structure 10 further comprises at least one protruded wall 17 which can be formed on the edge of the housing 11, wherein the height of the protruded wall 17 is greater than that of the protrusions 16. Thus, the protruded wall 17 of the LED package structure 10 in the first embodiment of the present invention is advantageous to execute the following SMT or other manufacturing processes of the LED package structure 10.

For more details, due to the change of the surface shape of the transparent encapsulant 15, a pathway of a light beam emitted by the LED chip 14 through the transparent encapsulant 15 will be changed. As shown in FIG. 3B, the uneven surface of the transparent encapsulant 15 can decrease the ratio of total reflection of the light beam, so as to increase the diffusion angle thereof. Moreover, the light emitted to the protrusions 16 will be reflected from the reflective layer on the surface of the protrusions 16, and then emitted out of the surface of the transparent encapsulant 15, so as to enhance the light extraction efficiency.

Figure 4:
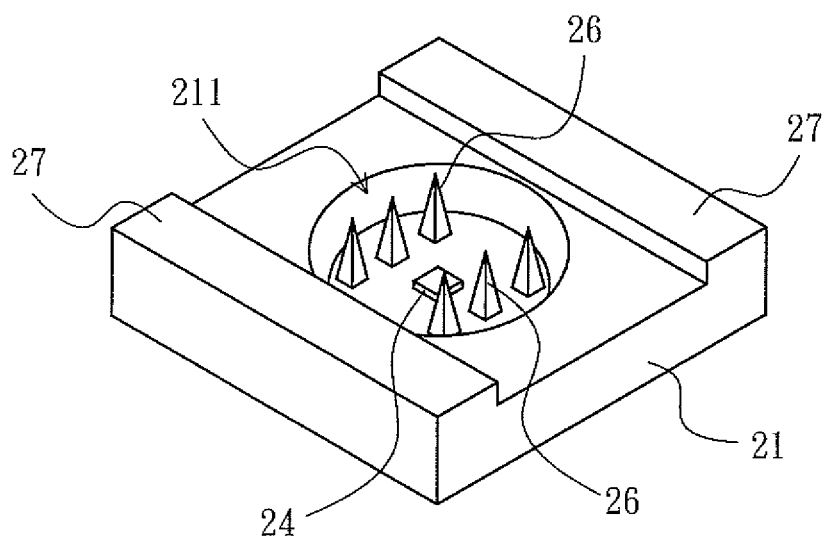
FIG. 4 is a perspective view of a housing and an LED chip of an LED package structure according to a second embodiment of the present invention.

Referring now to FIG. 4, FIG. 4 is a perspective view of a housing and an LED chip of an LED package structure according to a second embodiment of the present invention. The LED package structure 20 of the embodiment is similar to the LED package structure 10 of the first embodiment, so that the embodiment uses the same terms of the first embodiment. The difference between the two embodiments is that: the protrusions 26 of the embodiment are arranged in a mirror symmetrical arrangement with respect to the LED chip 24, while a surface of each of the protrusions 26 has a reflective layer (not-shown). The LED package structure 20 has a smaller visual angle in the arrangement direction of the protrusions 26 and a greater visual angle in a direction vertical to the arrangement direction thereof. Thus, the LED package structure 20 can suitably satisfy different usage needs, such as be used as a light source of a side-light type backlight module.

Figure 5:
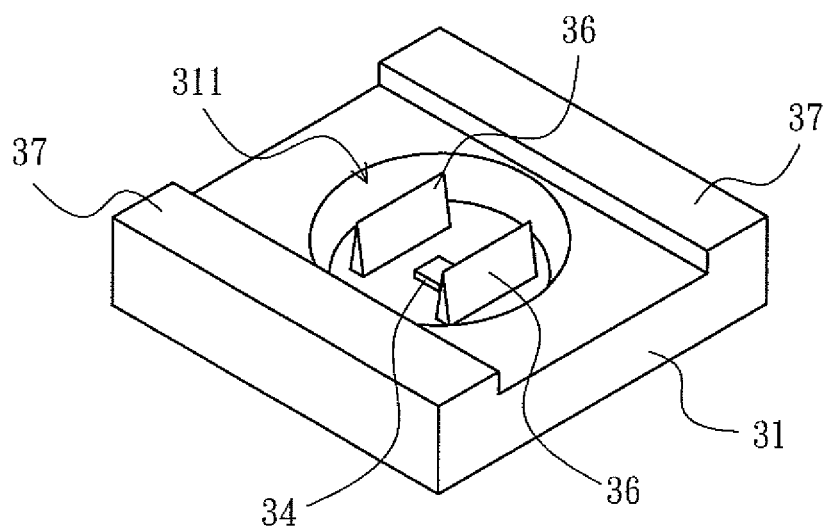
FIG. 5 is a perspective view of a housing and an LED chip of an LED package structure according to a third embodiment of the present invention.

Referring now to FIG. 5, FIG. 5 is a perspective view of a housing and an LED chip of an LED package structure according to a third embodiment of the present invention. The LED package structure 30 of the embodiment is similar to the LED package structure 20 of the second embodiment, so that the embodiment uses the same terms of the second embodiment. The difference between the two embodiments is that: the housing 31 of the embodiment has two protrusions 36 which are arranged in a mirror symmetrical arrangement with respect to the LED chip 34, wherein the protrusions 36 are plates, while the surface of each of the protrusions 36 has a reflective layer (not-shown).

Figure 6A:
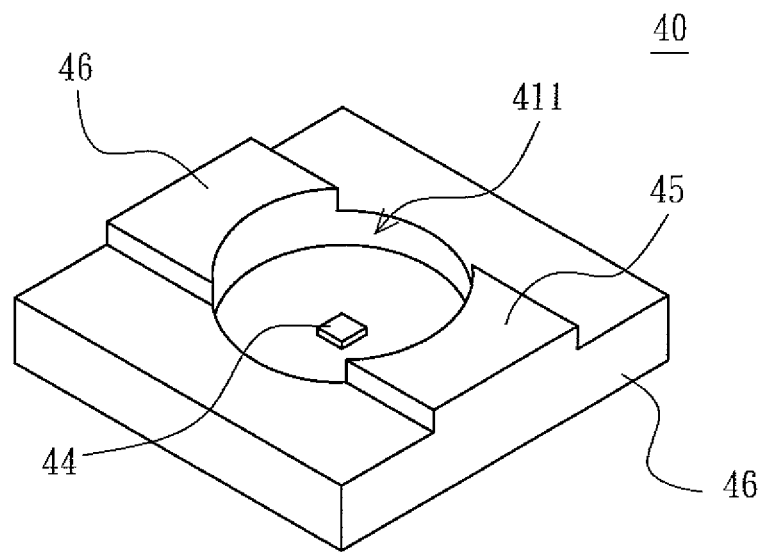
FIG. 6A is a perspective view of a housing and an LED chip of an LED package structure according to a fourth embodiment of the present invention.
Figure 6B:
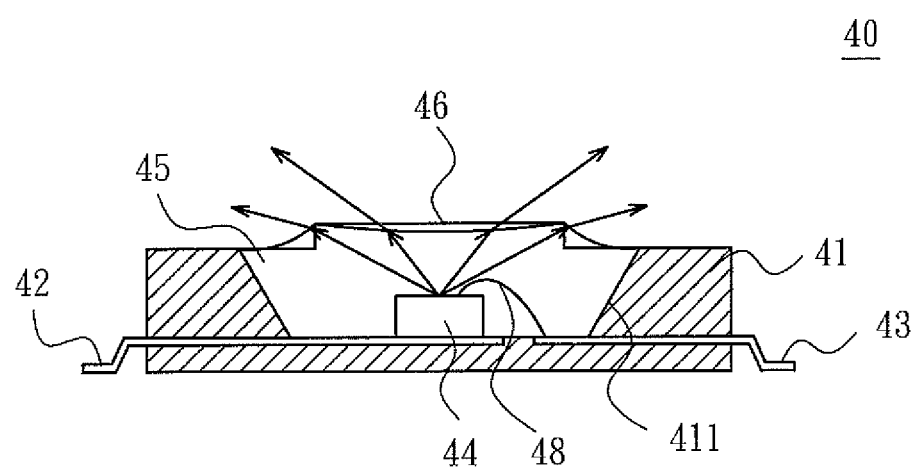
FIG. 6B is a cross-sectional view of the LED package structure according to the fourth embodiment of the present invention.

Referring now to FIGS. 6A and 6B, FIG. 6A is a perspective view of a housing and an LED chip of an LED package structure according to a fourth embodiment of the present invention; and FIG. 6B is a cross-sectional view of the LED package structure according to the fourth embodiment of the present invention. In the embodiment, the LED package structure 40 comprises: a housing 41, a first electrode 42, a second electrode 43, an LED chip 44 and a transparent encapsulant 45. An upper surface of the housing 41 has a recess 411 which is a recessed structure and the shape of the recess 411 can be adjusted corresponding to product needs. A periphery of the housing 41 is extended upward to form the protrusions 46, wherein the protrusions 46 are formed on the periphery (edge) of the housing 41, while the protrusions 46 are formed on two opposite sides of the recess 411.

A portion of the first electrode plate 42 is disposed in the recess 411, and the other portion thereof is extended out of the housing 41 for being electrically connected with an external power supply. A portion of the second electrode plate 43 is disposed in the recess 411, and the other portion thereof is extended out of the housing 41 for being electrically connected with an external power supply. The LED chip 44 has a first electrode (not-shown) and a second electrode (not-shown). The LED chip 44 is disposed in the recess 411, wherein the first electrode is electrically connected with the first electrode plate 42, and the second electrode is electrically connected with the second electrode plate 43 through a first wire 48.

The transparent encapsulant 45 encapsulates the recess 411 and covers the LED 44, the portion of the first electrode plate 42 and the portion of the second electrode plate 43 in the recess 411. As shown in FIG. 6B, after molding the transparent encapsulant 45, the surface of the transparent encapsulant 45 will be formed with protruded appearance at the positions of the protrusions 46 due to the surface tension action. In other words, the protrusions 46 change the surface shape of the transparent encapsulant 45.

Furthermore, preferably, the height of the protrusions 46 of the LED package structure 40 is greater than that of the transparent encapsulant 45. Thus, the protrusions 46 of the LED package structure 40 in the fourth embodiment of the present invention is advantageous to execute the following SMT or other manufacturing processes of the LED package structure 40.

For more details, in the embodiment, the LED package structure 40 can provide the same technological effect of the LED package structure 10 in the first embodiment of the present invention. In the embodiment, due to the protrusions 46, the surface shape of the transparent encapsulant 45 of the LED package structure 40 are changed, and thus a pathway of a light beam emitted through the transparent encapsulant 45 will be changed. As shown in FIG. 6B, the uneven surface of the transparent encapsulant 45 can generate an effect of a convex lens. Thus, most of the light beam is emitted outward through the transparent encapsulant 45, so as to increase the diffusion angle thereof and enhance the light extraction efficiency.

In addition, the LED package structure 40 has a greater visual angle in the arrangement direction of the protrusions 46 and a smaller visual angle in a direction vertical to the arrangement direction thereof. Thus, the LED package structure 40 can suitably satisfy different usage needs, such as be used as a light source of a side-light type backlight module.

Figure 7:
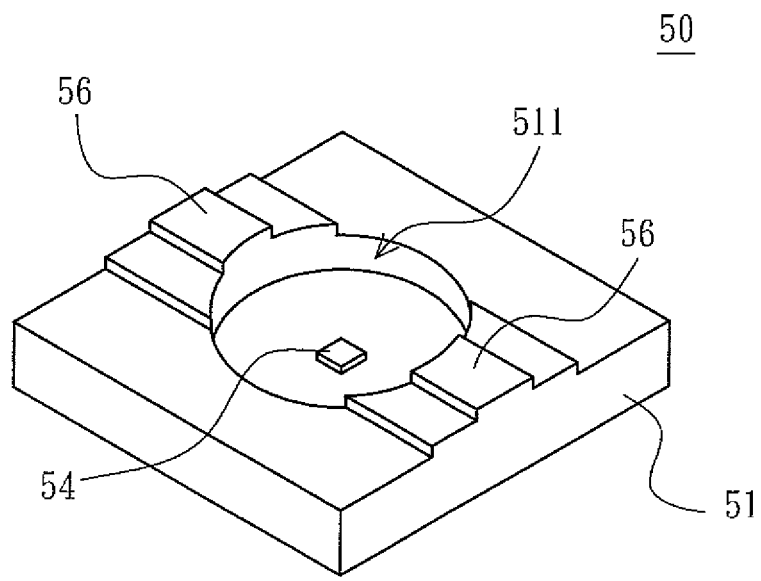
FIG. 7 is a perspective view of a housing and an LED chip of an LED package structure according to a fifth embodiment of the present invention.

Referring now to FIG. 7, FIG. 7 is a perspective view of a housing and an LED chip of an LED package structure according to a fifth embodiment of the present invention. The LED package structure 50 of the embodiment is similar to the LED package structure 40 of the fourth embodiment, so that the embodiment uses the same terms of the fourth embodiment. The difference between the two embodiments is that: in the embodiment, the protrusions 56 are arranged in a multi-stage arrangement descending from the centermost one of the protrusions 56 to the outermost one thereof. Thus, the descending manner and multi-stage variation can be used to design the height difference between the protrusions 56. Similarly, the LED package structure 50 has a greater visual angle in the arrangement direction of the protrusions 56 and a smaller visual angle in a direction vertical to the arrangement direction thereof, so as to suitably satisfy different usage needs.

Figure 8:
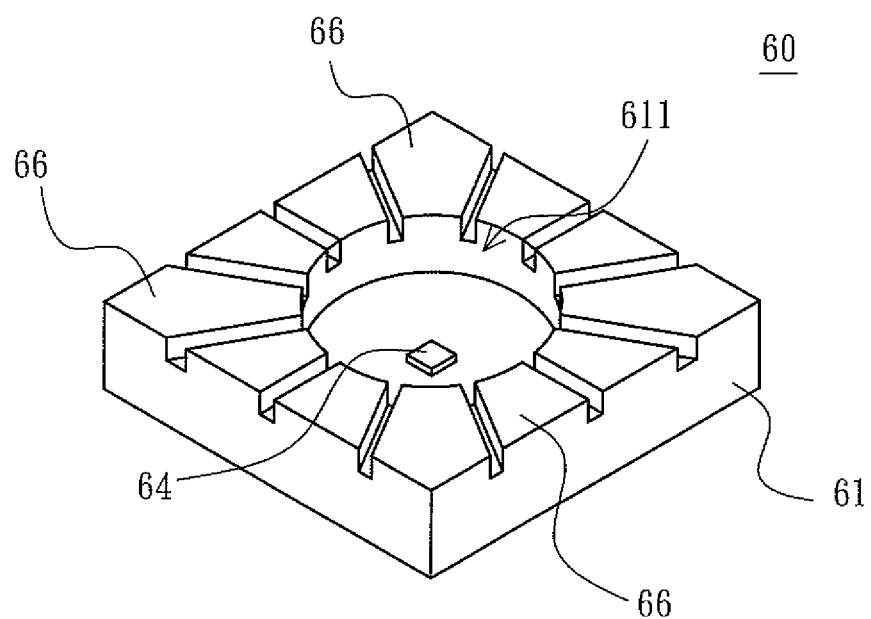
FIG. 8 is a perspective view of a housing and an LED chip of an LED package structure according to a sixth embodiment of the present invention.

Referring now to FIG. 8, FIG. 8 is a perspective view of a housing and an LED chip of an LED package structure according to a sixth embodiment of the present invention. The LED package structure 60 of the embodiment is similar to the LED package structure 40 of the fourth embodiment, so that the embodiment uses the same terms of the fourth embodiment. The difference between the two embodiments is that: in the sixth embodiment of the present invention, the protrusions 66 are arranged in a circular array (matrix) with respect to the LED chip 64. Preferably, the protrusions 66 are extended toward the edge and radially arranged. Thus, LED package structure 60 of the embodiment uses the gradual variation or periodical arrangement to change the surface of the transparent encapsulant 65, so as to improve the central recessed defect of the transparent encapsulant 65 due to the shrinkage of the material after hardening and the surface tension action on the edge of the recess 611. In addition, the radial arrangement of the protrusions 66 is extended to planar surfaces which are advantageous to execute the following SMT or other manufacturing processes of the LED package structure 60.

As described above, in comparison with the traditional LED package structure, the housing of the LED package structure of the present invention is provided with the protrusions can cause the surface of the transparent encapsulant encapsulating the housing and the LED chip to have an uneven shape, so as to decrease the ratio of total reflection of the light beam emitted by the LED chip through the transparent encapsulant, so as to enhance the light extraction efficiency.

The present invention has been described with a preferred embodiment thereof and it is understood that many changes and modifications to the described embodiment can be carried out without departing from the scope and the spirit of the invention that is intended to be limited only by the appended claims.

The invention claimed is:

1. A light emitting diode (LED) package structure, characterized in that: the LED package structure comprises:
   a housing having a recess and a plurality of protrusions, wherein the protrusions are formed on a bottom surface of the recess, and the protrusions are higher than an edge of the housing;
   an LED chip mounted in the recess of the housing; and
   a transparent encapsulant encapsulating the recess of the housing and covering the LED chip in the recess, wherein the transparent encapsulant has an uneven surface.

2. The LED package structure according to claim 1, characterized in that: the transparent encapsulant encapsulates the protrusions.

3. The LED package structure according to claim 1, characterized in that: the protrusions are cones which are arranged in a circular array or a mirror symmetrical arrangement with respect to the LED chip.

4. The LED package structure according to claim 1, characterized in that: the protrusions are plates which are arranged in a mirror symmetrical arrangement with respect to the LED chip.

5. The LED package structure according to claim 1, characterized in that: the housing further comprises at least one protruded wall, and a height of the protruded wall is greater than that of the protrusions.

6. The LED package structure according to claim 1, characterized in that: a surface of each of the protrusions has a reflective layer.

7. A light emitting diode (LED) package structure, characterized in that: the LED package structure comprises:
   a housing having a recess and a plurality of protrusions, wherein the protrusions is formed on a bottom surface of the housing, and the protrusions are higher than an edge of the housing;
   an LED chip mounted in the recess of the housing;
   a transparent encapsulant encapsulating the recess of the housing and covering the LED chip in the recess, wherein the transparent encapsulant has an uneven surface; and
   at least one protruded wall having a height greater than that of the protrusions.

8. The LED package structure according to claim 7, characterized in that: the protrusions are cones which are arranged in a circular array or a mirror symmetrical arrangement with respect to the LED chip.

9. The LED package structure according to claim 7, characterized in that: the protrusions are plates which are arranged in a mirror symmetrical arrangement with respect to the LED chip.

10. The LED package structure according to claim 7, characterized in that: a surface of each of the protrusions has a reflective layer.

* * * * *